(12) United States Patent
Camacho et al.

(10) Patent No.: US 6,667,922 B1
(45) Date of Patent: Dec. 23, 2003

(54) SENSING AMPLIFIER WITH SINGLE SIDED WRITEBACK

(75) Inventors: Stephen Michael Camacho, Durham, NC (US); Paul Edward Brucke, Durham, NC (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/224,740

(22) Filed: Aug. 21, 2002

(51) Int. Cl.[7] .................................................. G11C 7/00
(52) U.S. Cl. ........................................ 365/205; 365/196
(58) Field of Search ................................. 365/205, 196, 365/191, 203, 189.02, 190

(56) References Cited

U.S. PATENT DOCUMENTS

| | | | | |
|---|---|---|---|---|
| 4,799,197 A | * | 1/1989 | Kodama et al. | 365/205 |
| 6,144,603 A | * | 11/2000 | Makino | 365/205 |
| 6,314,028 B1 | * | 11/2001 | Kono | 365/189.09 |
| 6,516,006 B1 | | 2/2003 | Walker et al. | |

* cited by examiner

Primary Examiner—Thong Le
(74) Attorney, Agent, or Firm—Brinks Hofer Gilson & Lione

(57) ABSTRACT

A method of transferring data to a memory storage cell that is attached to a first bitline. The method includes passing a charge representative of data from a memory storage cell to a first bitline that is connected to the memory storage cell and detecting that the charge is on the first bitline. Upon detecting the charge is on the first bitline, preventing a portion of a second bitline that is complementary to the first bitline from being driven to a full voltage state.

16 Claims, 5 Drawing Sheets

SENSING AMPLIFIER WITH SINGLE SIDED WRITEBACK

BACKGROUND OF THE INVENTION

1. Field of the Invention

The present invention relates to the field of memory chips.

2. Discussion of Related Art

A known integrated memory IC 100 that is a writeable memory of the DRAM type is shown in FIG. 1. Such a dynamic random access memory (DRAM) chip 100 includes a plurality of memory storage cells 102 in which each cell 102 has a transistor 104 and an intrinsic capacitor 106. As shown in FIGS. 2 and 3, the memory storage cells 102 are arranged in arrays 108, wherein memory storage cells 102 in each array 108 are interconnected to one another via columns of conductors 110, known as bitlines, and rows of conductors 112, known as wordlines. One half of the memory storage cells 102 are connected to a bitline while the remainder of the memory storage cells are connected to a complementary bit line. As shown in FIG. 4, the transistors 104 are used to charge and discharge the capacitors 106 to certain voltage levels. The capacitors 106 then store the voltages as binary bits, 1 or 0, representative of the voltage levels. The binary 1 is referred to as a "high" and the binary 0 is referred to as a "low." The voltage value of the information stored in the capacitor 106 of a memory storage cell 102 is called the logic state of the memory storage cell 102.

As shown in FIGS. 1 and 2, the memory chip 100 includes six address input contact pins A0, A1, A2, A3, A4, A5 along its edges that are used for both the row and column addresses of the memory storage cells 102. The row address strobe (RAS) input pin receives a signal RAS that clocks the address present on the DRAM address pins A0 to A5 into the row address latches 114. Similarly, a column address strobe (CAS) input pin receives a signal CAS that clocks the address present on the DRAM address pins A0 to A5 into the column address latches 116. The memory chip 100 has data pin Din that receives data and data pin Dout that sends data out of the memory chip 100. The modes of operation of the memory chip 100, such as Read, Write and Refresh, are well known and so there is no need to discuss them for the purpose of describing the present invention.

A variation of a DRAM chip is shown in FIGS. 5 and 6. In particular, by adding a synchronous interface between the basic core DRAM operation/circuitry of a second generation DRAM and the control coming from off-chip a synchronous dynamic random access memory (SDRAM) chip 200 is formed. The SDRAM chip 200 includes a bank of memory arrays 208 wherein each array 208 includes memory storage cells 210 interconnected to one another via columns and rows of conductors.

As shown in FIGS. 5 and 6, the memory chip 200 includes twelve address input contact pins A0–A11 that are used for both the row and column addresses of the memory storage cells of the bank of memory arrays 208. The row address strobe (RAS) input pin receives a signal RAS that clocks the address present on the DRAM address pins A0 to A11 into the bank of row address latches 214. Similarly, a column address strobe (CAS) input pin receives a signal CAS that clocks the address present on the DRAM address pins A0 to A11 into the bank of column address latches 216. The memory chip 200 has data input/output pins DQ0-15 that receive and send input signals and output signals. The input signals are relayed from the pins DQ0-15 to a data input register 218 and then to a DQM processing component 220 that includes DQM mask logic and write drivers for storing the input data in the bank of memory arrays 208. The output signals are received from a data output register 222 that received the signals from the DQM processing component 220 that includes read data latches for reading the output data out of the bank of memory arrays 208. The modes of operation of the memory chip 200, such as Read, Write and Refresh, are well known and so there is no need to discuss them for the purpose of describing the present invention.

In both of the memory chips 100 and 200 of FIGS. 1–6, the corresponding memory arrays 108, 208 are connected to sensing amplifiers 300. An example of a known sensing amplifier 300 is shown within the rectangular dashed line box of FIG. 7 and includes primary pass transistors 302, 304 and secondary pass transistors 306, 308, 310. Each of the pass transistors of the sensing amplifier 300 is controlled by bitlines 110, 312 and the MUX ("multiplexed") and EQ ("equalized") signals shown in FIG. 7. As shown in FIG. 7, the sensing amplifier 300 further includes criss-crossed transistors 314 that are connected with the bitline 110 and the complementary bitline 312 and receive the signals NSET and PSET. The sensing amplifier 300 detects small voltage differences between the bitlines 110 and the complementary bitlines 312.

In operation, the bitlines 110 and the complementary bitlines 312 are equalized to a voltage level VBLEQ prior to the activation of a wordline 112 as shown in FIG. 8. While the bitlines 110 and the complementary bitlines 312 are equalized, the gate voltages MUX and EQ of the gates of the pass transistors 302, 304, 306, 308, 310 are set at a common voltage of VINT, the voltage of the internal voltage supply, as shown in FIG. 8. Note that the MUX signal is used to determine which one of a pair of bitlines to which the signals NSET and PSET are applied.

Once a wordline 112 is activated, a number of events occur. For example, selection of a wordline 112 causes all memory cells connected to the wordline 112 to be opened. In addition, the open memory cells are connected to bitlines that are connected to sense amplifiers. A small charge or data is temporarily stored in capacitor 106 where it can be passed onto the bitline. The small charge or data stored in the memory storage cells 102, 210 is passed onto the drain D of the transistor 104 and then placed on one of the complementary bitlines 312 via the transistors 302, 304. Since the stored charge is placed on the complementary bitlines 312 and not the bitlines 110, a small voltage difference between the bitlines 312 and the bitlines 110 results. The small voltage difference is detected by the sensing amplifier 300 which restores or writesback the charge/data placed on the complementary bitlines 312 by driving one of the complimentary bitlines 312 to a high state voltage VBLH and the corresponding bitline 110 to a low state voltage, such as ground GND, as shown in FIG. 8. The sensing amplifier 300 restores the charge by having the signal PSET move from its normal voltage of VBLEQ to a high voltage while the other signal NSET moves from its normal voltage of VBLEQ to a low voltage. Having the signals NSET and PSET at high and low states causes the transistors 314 to drive a bitline all the way to either a high state or a low state and drive the complimentary bitline all the way to the opposite state. While the bitline 110 and complimentary bitline 312 are driven to different voltages, the voltage EQ is driven down to the low state voltage, such as GND, and the voltage MUX is driven up to the value VPP as shown in FIG. 8.

While the above description regards the situation where the charge or data is placed on a complementary bitline 312 and written back by applying a high state voltage to the complementary bitline 312, it is also possible that the charge or data is placed on and written back onto the bitline 110 via a process that is complementary to the one described above. In either scenario, the sensing amplifier 300 does not know whether the bitline 110 or the complementary bitline 312 is connected to the memory storage cell 102, 210. In this situation, the charge in the memory storage cell causes the bitline that is connected to the memory storage cell to be driven to the voltage level of that charge while the other bitline is driven to an equal, but opposite, voltage as shown in FIG. 8.

Due to the structure of the memory arrays 108, 208 described previously, the pass transistors 302, 304, 306, 308, 310 connect only one of the bitlines 110 and its corresponding complimentary bitline 312 to the memory storage cell 102. Another property of the memory cells 108, 208 is that the bitlines 110 and their complimentary bitlines 312 contain parasitic resistance and capacitance. Thus, when the bitlines 110 or complimentary bitlines 312 are switched from one voltage to another, the associated parasitic resistance and capacitance will cause a power loss for the particular bitline experiencing a switch in voltage. In the known process shown in FIG. 8, bitline 110 and its corresponding complimentary bitline 312, each experience a switch in voltage and, thus, each causes an undesired power loss.

SUMMARY OF THE INVENTION

One aspect of the present invention regards a memory system that includes an array of memory storage cells that has a memory storage cell. A first bitline is connected to the memory storage cell and a second bitline complementary to the first bitline not connected to the memory storage cell. A sensing amplifier is connected to the first bitline and the second bitline so as to detect a charge present on the first bitline, wherein the sensing amplifier receives signals that indicate that the first bitline is connected to the memory storage cell, wherein the sensing amplifier prevents a portion of the second bitline from being driven to a full voltage state based on receipt of the signals.

A second aspect of the present invention regards a method of transferring data to a memory storage cell that is attached to a first bitline. The method includes passing a charge representative of data from a memory storage cell to a first bitline that is connected to the memory storage cell and detecting that the charge is on the first bitline. Upon detecting the charge is on the first bitline, preventing a portion of a second biltline that is complementary to the first bitline from being driven to a full voltage state.

Each of the above aspects of the present invention provides the advantage of increasing power savings by reducing parasitic losses during recharging of a memory storage cell.

The present invention, together with attendant objects and advantages, will be best understood with reference to the detailed description below in connection with the attached drawings.

DETAILED DESCRIPTION OF THE INVENTION

Figure 9:
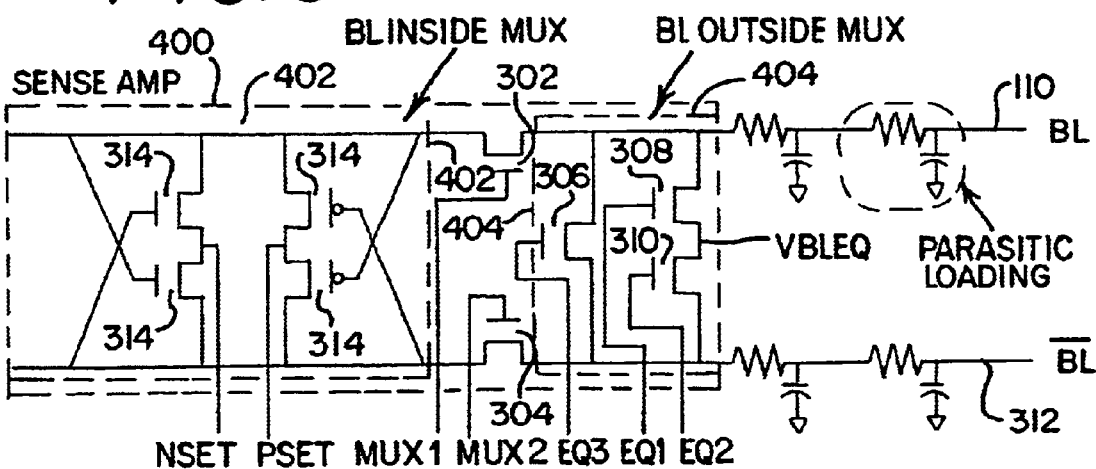
FIG. 9 schematically shows an embodiment of a sensing amplifier that can be used with the memory chips of FIGS. 1–6 according to the present invention.

As shown in FIG. 9, a sensing amplifier 400 according to the present invention (see rectangle denoted by dashed lines) is used with a memory array, such as the memory array 108 of the DRAM 100 or the memory array 208 of the SDRAM chip 200 described previously with respect to FIGS. 1–6.

Figure 1:
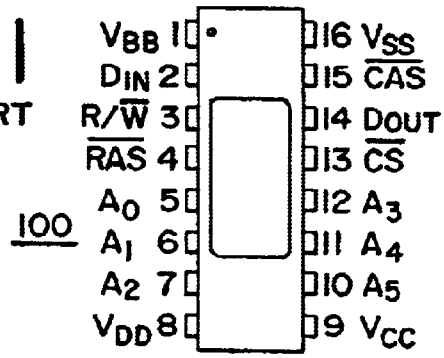
FIG. 1 schematically shows a top view of an embodiment of a known memory chip.
Figure 2:
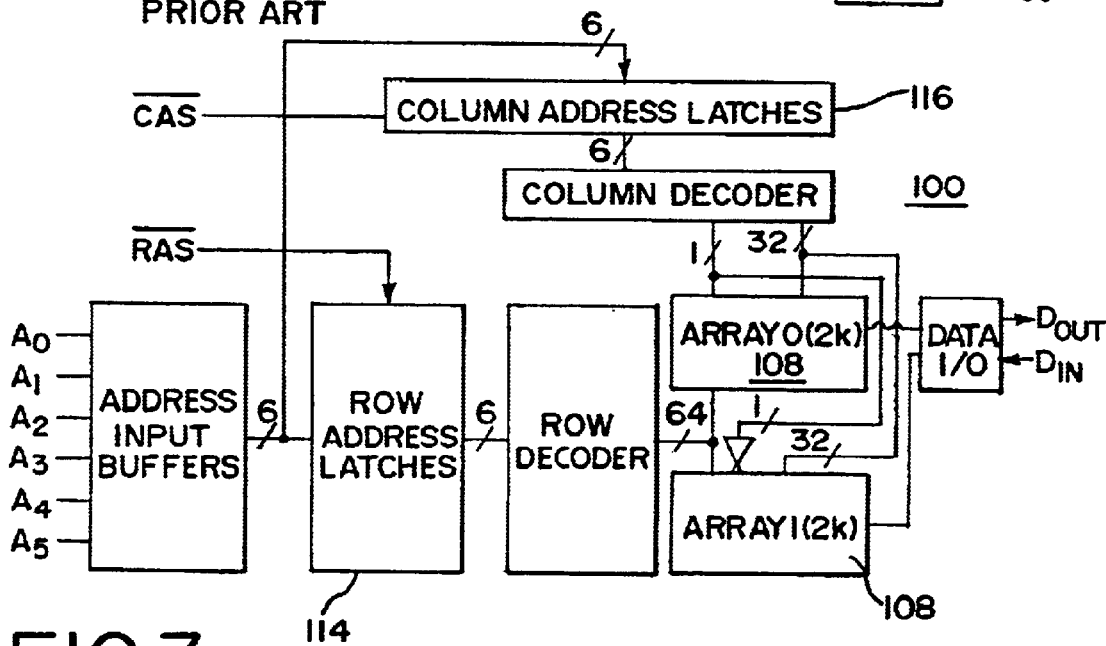
FIG. 2 shows a block diagram of the memory chip of FIG. 1.
Figure 3:
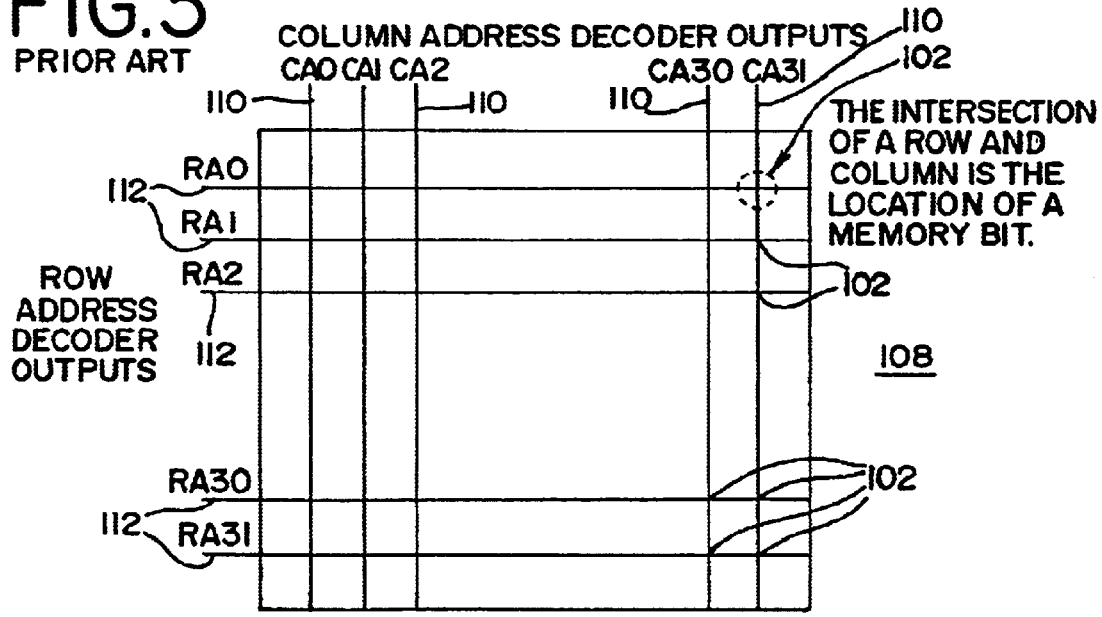
FIG. 3 schematically shows an embodiment of a memory array to be used with the memory chip of FIG. 1.
Figure 4:
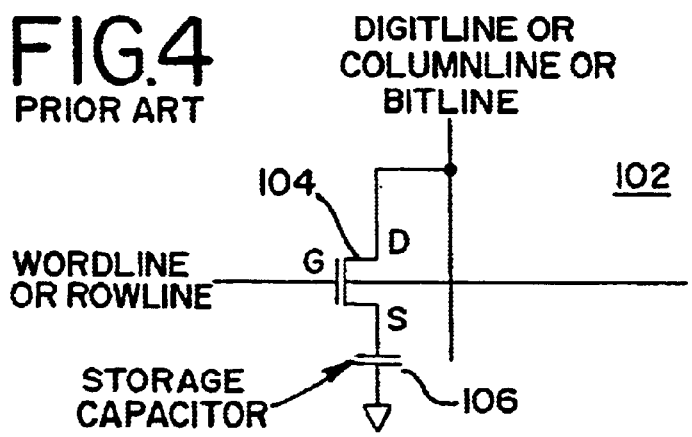
FIG. 4 schematically shows an embodiment of a memory cell to be used with the memory array of FIG. 3.
Figure 5:
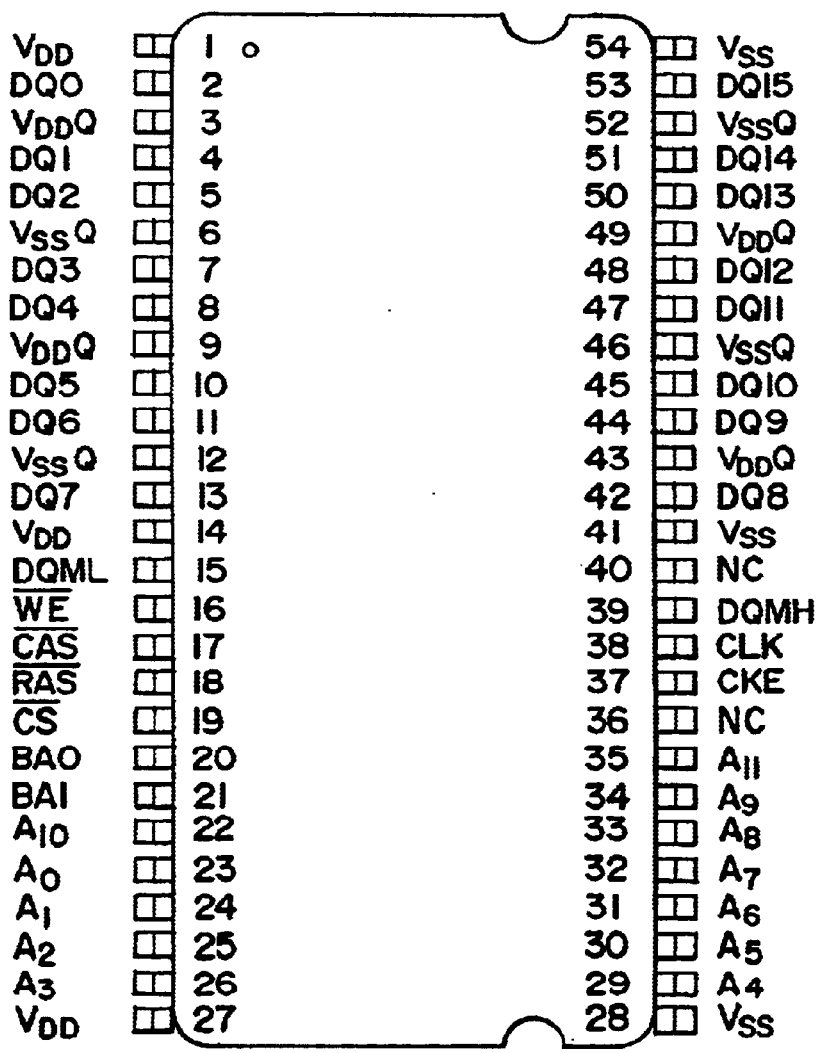
FIG. 5 schematically shows a top view of a second embodiment of a known memory chip.
Figure 6:
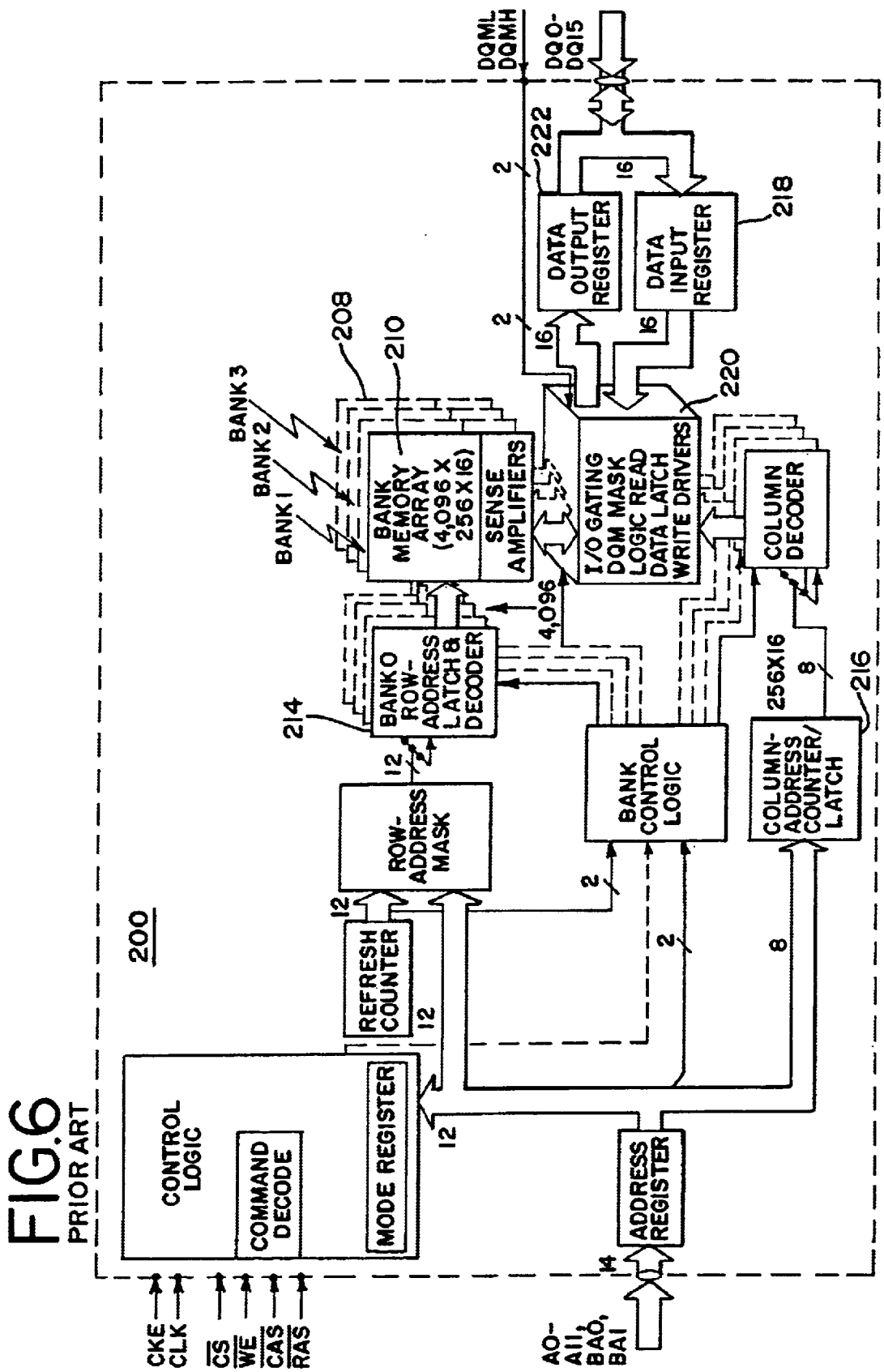
FIG. 6 shows a block diagram of the memory chip of FIG. 5.
Figure 7:
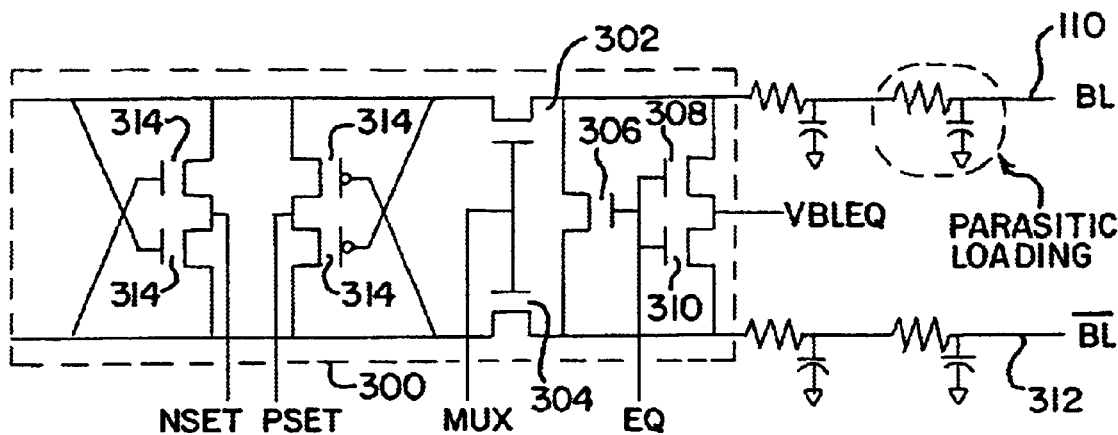
FIG. 7 schematically shows an embodiment of a known sensing amplifier that is used with the memory chips of FIGS. 1–6.

As shown in FIG. 9, the primary pass transistors 302, 304 are connected to a sensing circuit 402 (see dashed lines) and a switching circuit 404 (see dashed lines) of the sensing amplifier 400 via bitlines 110 and 312, respectively. The secondary pass transistors 306, 308 and 310 are connected to the sensing amplifier via both bitlines 110 and 312, wherein secondary pass transistor 306 is connected to the other two secondary pass transistors and the primary pass transistors 302, 304. The sensing amplifier 400 differs from the sensing amplifier 300 described previously with respect to FIG. 7 in that the gates of the primary pass transistors 302, 304 and secondary pass transistors 306, 308, 310 have voltages MUX1, MUX2, EQ1, EQ2 and EQ3 applied thereto via corresponding voltage sources that are independent of one another.

Figure 10:
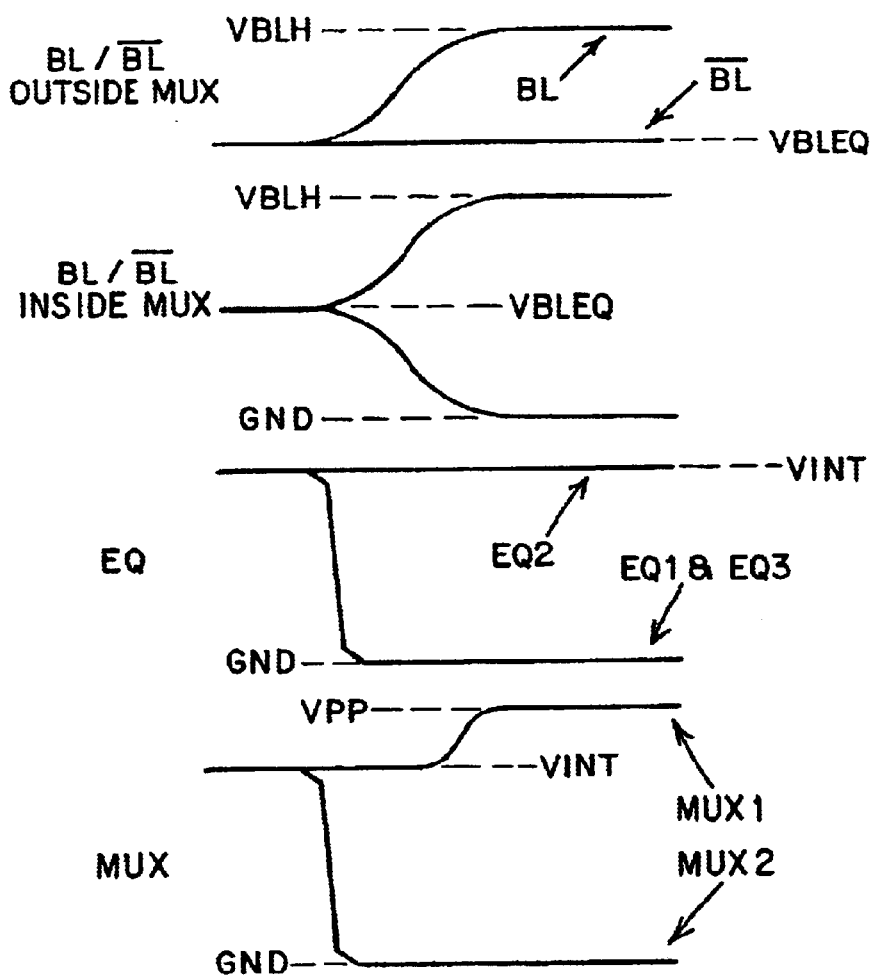
FIG. 10 shows a voltage diagram for an embodiment of a sensing method that can be used with the memory chips of FIGS. 1–6 and the sensing amplifier of FIG. 9 according to the present invention.

In operation, the bitlines 110 and the complementary bitlines 312 are equalized to a voltage level VBLEQ prior to the activation of a wordline 112 as shown in FIG. 10. Equalization is accomplished by opening all of the gates of transistors 302, 304, 306, 308, 310 so that the bitlines 110 and the complementary bitlines 312 are equalized to the same potential VBLEQ. This equalization process is similar to that described previously with respect to the equalization process shown in FIG. 8.

Figure 8:
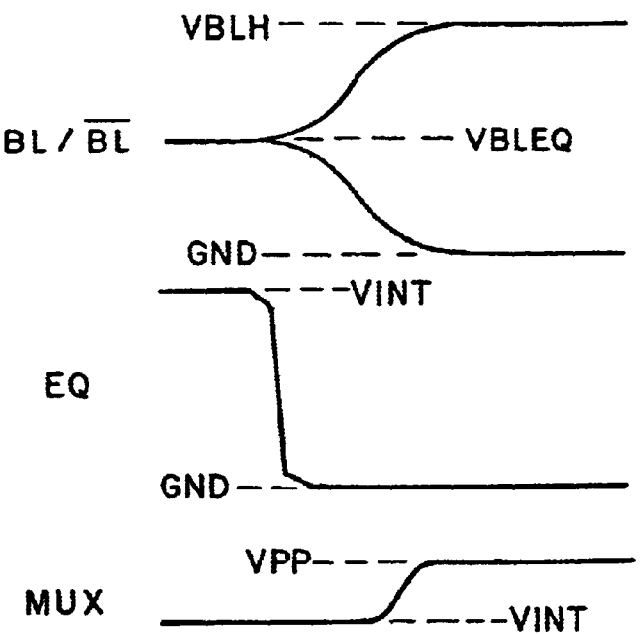
FIG. 8 shows a voltage diagram for an embodiment of a known sensing method that can be used with the memory chips and sensing amplifier of FIGS. 1–7.

One difference between the processes shown in FIGS. 8 and 10 occurs when a wordline 112 is activated. Upon activation, the address of the wordline 112 is decoded so that information regarding which bitline the wordline 112 is to be connected to is revealed. Note that the coding of the wordline 112 can be accomplished in a number of ways that are known in the art and that are dependent on the particular architecture of the memory array.

In the example to be explained, the decoded information reveals that the wordline 112 is to be connected to the bitline 110. The memory storage cells 102, 210 connected to the bitline 110 are to be sensed by sensing amplifier 400. In this example, selection of a wordline 112 causes all memory storage cells connected to the wordline 112 to be opened. In addition, the open memory cells are connected to bitlines that are connected to sense amplifiers.

With the knowledge of which bitline is to be connected to the activated wordline 112 and the memory storage cell, the present invention is able to control the voltages of the bitlines in an advantageous manner. In our example, signals EQ1, EQ2, EQ3, MUX1 and MUX2 are selected so that the outside MUX portion of the complementary bitline 312 (see portion of bitline 312 that forms part of switching circuit 404) is disconnected from the sense amplifier 400 and connected to the voltage VBLEQ. The signals EQ1, EQ2, EQ3, MUX1 and MUX2 also connect the outside MUX portion of the bitline 110 to the sense amplifier 400. In this configuration, a small charge or data stored in the memory storage cells 102, 210 is placed on the bitline 110 via the transistors. As shown in FIG. 10, the small voltage difference detected by the sensing amplifier 400 causes the restoring or writingback of the charge/data placed on the bitlines 110 by driving both the inside MUX portion of the bitline 110 (see portion of bitline that forms part of sensing circuit 402) and the outside MUX portion of the bitline 110 that are actually connected to the memory storage cell 102, 210 to a full high state voltage, such as the high state voltage VBLH.

As shown in FIG. 9, the outside MUX portions of the bitline 110 and complementary bitline 312 are connected to transistor 306. The outside MUX portions of the bitline 110 and the complementary bitline 312 are also connected to a pair of transistors 308, 310, respectively, and to one another along a common portion that is kept at a constant voltage VBLEQ.

The outside MUX portions of the bitline 110 and complementary bitline 312 are connected to the inside MUX portions of the bitline 110 and complementary bitline 312 via transistors 302, 304.

As shown in FIG. 9, the inside MUX portions of the bitline 110 and complementary bitline 312 are connected to one another via two pairs of criss-crossed transistors 314.

The outside MUX portion of the complementary bitline 312 remains at the equalization level VBLEQ and the inside MUX portion of the bitline 312 has its voltage lowered to a low state voltage, such as GND, as shown in FIG. 10. Thus, only the bitline 110 that is switched to a full state voltage and connected to the memory storage cell 102, 210 will produce a power loss. Thus, there is a significant power savings since the parasitic losses are minimized for the complementary bitline 312 that is not connected to the memory storage cell 102, 210. While the inside MUX portion of the bitline 110 that is connected to the memory storage cell 102, 210 is driven to a full state, the voltages EQ1, EQ3 and MUX2 are driven down to the low state voltage, such as GND, the voltage EQ2 remains unchanged and MUX1 is driven up to the value VPP as shown in FIG. 10. Furthermore, the crossed transistors 314 of FIG. 9 operate in a manner similar to the crossed transistors of FIG. 7 in that they cause the inside MUX portions of the bitlines 110 and 312 to split fully from one another in the same manner as described previously with respect to the system described previously with respect to FIGS. 7 and 8.

Please note that while the above example regards the situation where memory storage cells associated with the bitline are sensed, it is applicable in a similar manner to the situation when memory storage cells associated with the complementary bitline are sensed.

In summary, the present invention takes advantage of the fact that only one bitline is actually connected to a memory storage cell. Consequently, it is not necessary to drive the complementary bitline to a full low or high level to restore data to the storage memory cell. Accordingly, the present invention only drives the bitline actually connected to the memory storage cell to a full level. This results in a power loss being encountered by the bitline connected to the memory storage cell while the complementary bitline does not encounter such a power loss. Accordingly, the present invention provides significant power savings.

The foregoing description is provided to illustrate the invention, and is not to be construed as a limitation. Numerous additions, substitutions and other changes can be made to the invention without departing from its scope as set forth in the appended claims.

We claim:

1. A memory system, comprising:
   an array of memory storage cells that comprises a memory storage cell;
   a first bitline;
   a second bitline complementary to said first bitline,
   a wordline for connecting said memory storage cell to said first bitline or to said second bitline, and
   a sensing amplifier connected to said first bitline and said second bitline so as to detect a voltage difference between said first and second bitlines, wherein said sensing amplifier receives signals that indicate whether said memory storage cell is connected to said first bitline or to said second bitline, wherein said sensing amplifier prevents a portion of said bitline, which is not connected to said memory storage cell, from being driven to a full voltage state based on receipt of said signals.

2. The memory system of claim 1, wherein a portion of said bitline, which is not connected to said memory storage cell, is disconnected from said sensing amplifier based on said sensing amplifier receiving said signals.

3. The memory system of claim 1, wherein a portion of said bitline, which is not connected to said memory storage cell, is connected to a voltage that is not at a full voltage state based on said sensing amplifier receiving said signals.

4. The memory system of claim 2, wherein said portion of said bitline, which is not connected to said memory storage cell, is connected to a voltage that is not at a full voltage state based on said sensing amplifier receiving said signals.

5. The memory system of claim 1, wherein said sensing amplifier drives said bitline, which is connected to said memory storage cell, to a full voltage state based on said sensing amplifier receiving said signals.

6. The memory system of claim 1, wherein said sensing amplifier comprises:
   a switching circuit that prevents a portion of said bitline, which is not connected to said memory storage cell, from being driven to said full voltage state; and
   a sensing circuit connected to said switching circuit, said sensing circuit sensing a charge on said bitline, which is connected to said memory storage cell.

7. The memory system of claim 6, wherein said sensing amplifier further comprises:
   a first transistor connected to said sensing circuit and said switching circuit via said bitline which is not connected to said memory storage cell; and
   a second transistor connected to said sensing circuit and said switching circuit via said bitline, which is connected to said memory storage cell, said first transistor receives one of said signals and said second transistor receives a second one of said signals.

8. The memory system of claim 6, wherein said switching circuit comprises:

a first transistor connected to said bitline, which is not connected to said memory storage cell, and said bitline, which is connected to said memory storage cell, said first transistor receives one of said signals; and a second transistor connected to said bitline, which is not connected to said memory storage cell; and a third transistor that is connected to said bitline, which is connected to said memory storage cell, said second transistor receives a second one of said signals and said third transistor receives a third one of said signals.

9. The memory system of claim 6, wherein said sensing circuit comprises first and second crossed transistors that receive one of said signals.

10. The memory system of claim 8, wherein said sensing circuit comprises first and second crossed transistors that receive one of said signals.

11. The memory system of claim 7, wherein said switching circuit comprises:

a first transistor connected to said bitline, which is not connected to said memory storage cell, and said bitline, which is connected to said memory storage cell, said first transistor receives a third one of said signals;

a second transistor connected to said bitline, which is not connected to said memory storage cell; and a third transistor that is connected to said bitline, which is connected to said memory storage cell, said second transistor receives a fourth one of said signals and said third transistor receives a fifth one of said signals.

12. The memory system of claim 11, wherein said sensing circuit comprises first and second crossed transistors that receive a sixth one of said signals.

13. The memory system of claim 8, wherein a common connection between said second transistor and said third transistor is constrained to be at a constant voltage.

14. A method of transferring data to a memory storage cell that is attached to a first bitline, comprising:

passing a charge representative of data from a memory storage cell to a first bitline that is connected to said memory storage cell;

detecting that said charge is on said first bitline; and upon detecting said charge is on said first bitline, preventing a portion of a second bitline that is complementary to said first bitline from being driven to a full voltage state.

15. The method of claim 14, further comprising driving an entire portion of said first bitline to a full voltage state.

16. The method of claim 14, further comprising setting voltages of said first bitline and said second bitline to a common voltage level prior to said passing said charge from said memory storage cell to said first bitline.

* * * * *